United States Patent [19]

Hara

[11] Patent Number: 5,448,112
[45] Date of Patent: Sep. 5, 1995

[54] PLASTIC SEALED MULTIPLE LEVEL METALIZATION SEMICONDUCTOR DEVICE

[75] Inventor: Hideki Hara, Tokyo, Japan

[73] Assignee: NEC Corporation, Tokyo, Japan

[21] Appl. No.: 208,183

[22] Filed: Mar. 10, 1994

Related U.S. Application Data

[63] Continuation of Ser. No. 832,075, Feb. 6, 1992, abandoned.

[30] Foreign Application Priority Data

Feb. 7, 1991 [JP] Japan ................... 3-016214

[51] Int. Cl.$^6$ .............. H01L 23/48; H01L 29/46; H01L 29/54; H01L 29/62
[52] U.S. Cl. .................. 257/758; 257/759; 257/765; 257/767
[58] Field of Search ............ 357/71, 72, 74; 257/734, 748, 758, 759, 760, 765, 767, 771

[56] References Cited

U.S. PATENT DOCUMENTS 5,103,288  4/1992  Sakamoto et al. ............ 257/758
5,117,280  5/1992  Adachi ......................... 357/71

FOREIGN PATENT DOCUMENTS 2-297953  12/1990  Japan .

Primary Examiner—Sara W. Crane
Assistant Examiner—Carl Whitehead, Jr.
Attorney, Agent, or Firm—Burns, Doane, Swecker & Mathis

[57] ABSTRACT

A plastic sealed semiconductor device designed to prevent sliding of wiring due to thermal stress is disclosed. A lower layer wiring is provided adjacent to an outside of a portion of an uppermost layer of wiring covered by a cover film, which is arranged closest to an outer periphery of the semiconductor chip. Compressive stress of the sealing resin is divided by a step portion due to the uppermost layer of wiring and a step portion due to the lower layer of wiring. Further, since the interlayer insulating film covering the lower layer of wiring is flattened, the step portions are inclined gently in which stress is further divided. Therefore, the sliding of wiring is reliably prevented.

3 Claims, 2 Drawing Sheets

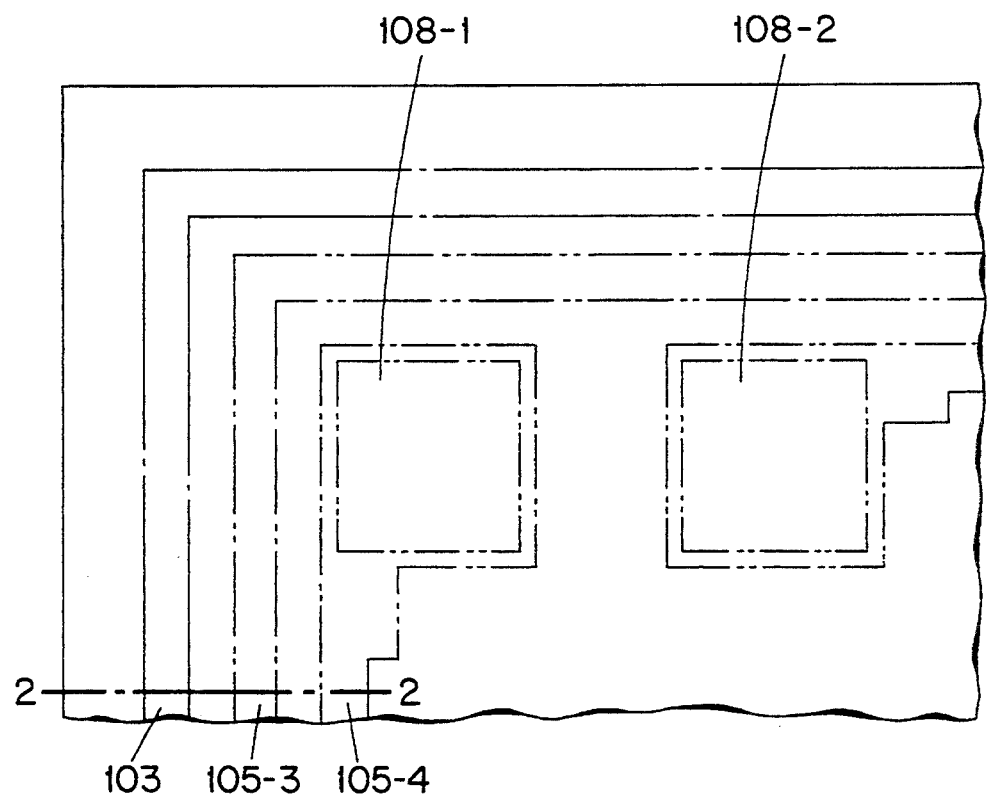
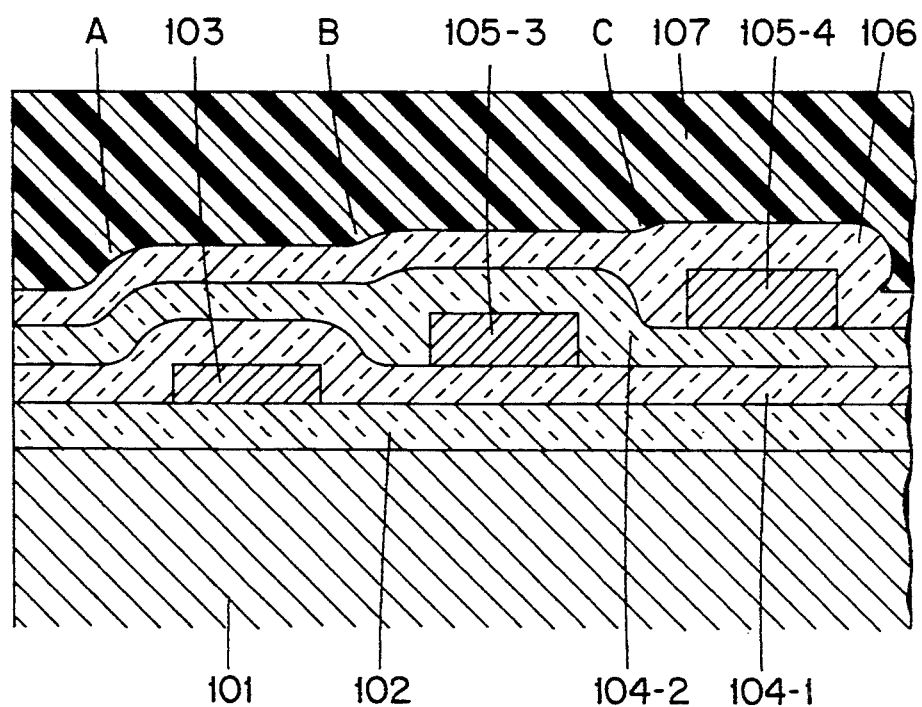

PLASTIC SEALED MULTIPLE LEVEL METALIZATION SEMICONDUCTOR DEVICE

This application is a continuation of application Ser. No. 07/832,075, filed Feb. 6, 1992 now abandoned.

BACKGROUND OF THE INVENTION

The present invention relates to a plastic sealed semiconductor device.

A plastic sealed semiconductor device having a semiconductor chip sealed with resin is subjected to thermal stress due to the difference in thermal expansion coefficient between the sealing resin and the semiconductor chip to be sealed thereby. With such thermal stress, an insulating film covering a major surface of the semiconductor chip tends to be cracked or an uppermost wiring layer of the chip tends to slide. The closer the portion of the semiconductor chip to a corner thereof provides the higher the chance of occurrence of such phenomena as sliding of the wiring layer.

There have been various approaches for preventing such defect as sliding. An example thereof is disclosed in JP-A-2-297953 in which a dummy conductive film is provided outside of the uppermost wiring layer. Such dummy conductive layer may be formed simultaneously with formation of the uppermost wiring layer. The function of such dummy conductive layer is to absorb compressive stress of sealing resin which is a main source of the sliding, etc., to thereby protect the wiring layer against sliding. This approach is considered practical since it is independent from choice of material for reduction of the difference in thermal expansion coefficient and does not require any additional fabrication step. However, there may be a risk of sliding of the dummy conductive film itself.

In the technical field of semiconductor integrated circuits, there is the continuous trend of increasing circuit integration density and miniaturizing circuit elements. For example, for a semiconductor memory, the number of bits to be stored has been increasing at a rate of four times per several years, while an area to be occupied by the memory chip is restricted up to about twice owing to the miniaturization effect of the constitutional components. With the increased size of the semiconductor chip, the phenomena such as above-mentioned slide, etc., tends to occur more easily. Further, due to an increase of use of the semiconductor device under severe environment such as on a vehicle or in desert area where thermal stress to be exerted on the semiconductor chip is considerable, the reliability of the semiconductor chip is highly required.

BRIEF SUMMARY OF THE INVENTION

Therefore, an object of the present invention is to provide a plastic sealed semiconductor device having means for reliably preventing slide of a wiring layer thereof from occuring.

A plastic sealed semiconductor device according to the present invention includes an n-th conductive film layer which selectively covers an insulating film covering a major surface of a rectangular silicon substrate. The n-th conductive film layer is arranged in areas each including a corner portion of the semiconductor chip. At least an interlayer insulating film is provided to cover the n-th conductive film layer. A wiring layer comprising a (n+m)th conductive film layer is selectively attached to an uppermost layer of the n-th conductive film layer such that it is in parallel to the n-th conductive film layer on inside areas of the corners of the semiconductor chip on which at least the n-th conductive film layer is provided. Further, a cover film covers the wiring layer.

Since compressive stress of the sealing resin is divided to step portions of the wiring and the n-th conductive film layer, the wiring is protected thereby. Since, although the n-th conductive film layer is covered with the interlayer insulating film by means of such as reflow, it is usual to flatten the interlayer insulating film, and its mechanical strength becomes higher compared with the covering film.

Further, since the step portion due to the n-th conductive film layer has gently inclined side walls, the stress dividing effect can be obtained also in the step portion. Therefore, the n-th conductive film layer hardly slides. The n-th conductive film layer is used as not only a dummy conductive film for preventing slide of the (n+m)th conductive film layer but also an actual wiring. According to the present invention, both the reliability and the integration density of the plastic sealed semiconductor device are improved.

BRIEF DESCRIPTION OF THE DRAWINGS

The above-mentioned and other objects, features and advantages of the present invention will become apparent by reference to the following detailed description of the present invention taken in conjunction with the accompanying drawings, wherein:

FIG. 2A is a plan view showing a second embodiment of the present invention schematically; and FIG. 2B is an enlarged cross section taken along a line 2—2 in FIG. 2A.

DETAILED DESCRIPTION OF THE PREFERRED EMBODIMENTS

A first embodiment of the present invention will be described with reference to FIGS. 1A and 1B.

Figure 1A:
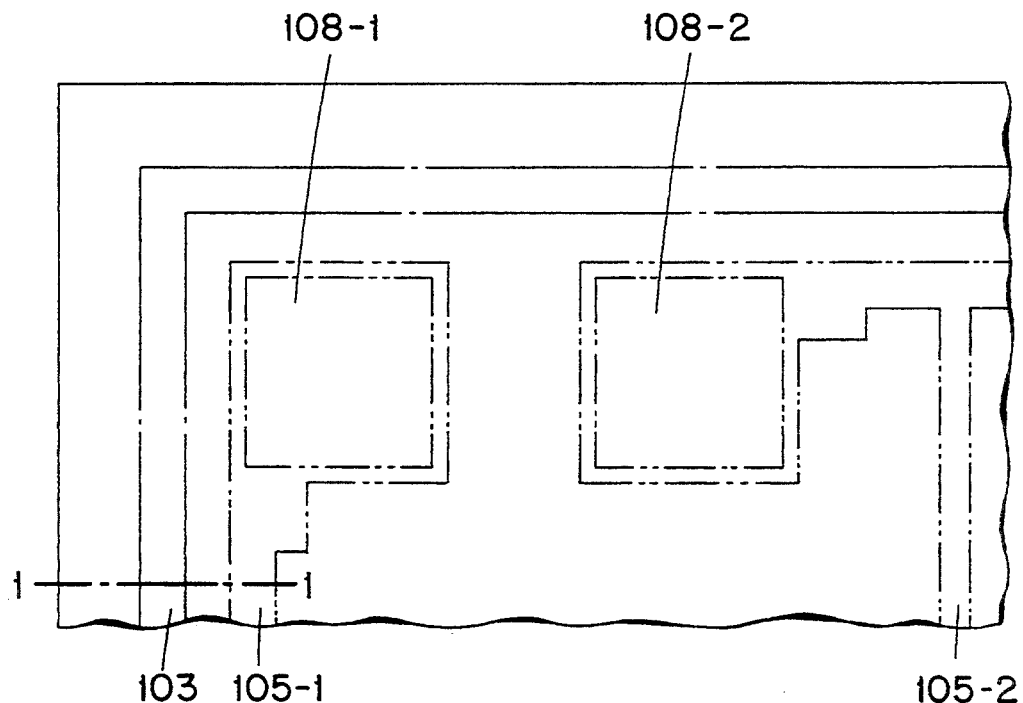
FIG. 1A is a plan view showing a first embodiment of the present invention schematically.

In FIG. 1A, for the purpose of simplicity of illustration, a sealing resin for a package is removed and only end portions of a cover film are shown by chain lines.

A polysilicon film 103 (first conductive film layer) is formed on a field oxide film 102 which is formed selectively on a major surface of a rectangular P type silicon substrate 101. The polysilicon film 103 is in the form of a rectangular ring and is formed on an outer peripheral portion of the semiconductor chip. The polysilicon film 103 may be formed in the same step as for forming a gate electrode of a MOS transistor as a circuit element. The polysilicon film 103 is covered with an interlayer insulating film 104. The interlayer insulating film 104 is of BPSG (Boro-Phospho-Silicate Glass) and is flattened by reflow. An aluminum film 105-1 (second conductive film layer) is formed inside a step portion of the interlayer insulating film 104 caused by the thickness of the polysilicon film 103. The aluminum film 105-1 is connected to a bonding pad 108-1 of aluminum film. The aluminum film 105-1 may be used as a signal line or a power source line. Another bonding pad 108-2 is arranged adjacent to the bonding pad 108-1 and connected to an aluminum film 105-2. A reference numeral 106 depicts a cover film of silicon nitride and 107 depicts sealing resin.

Figure 1B:
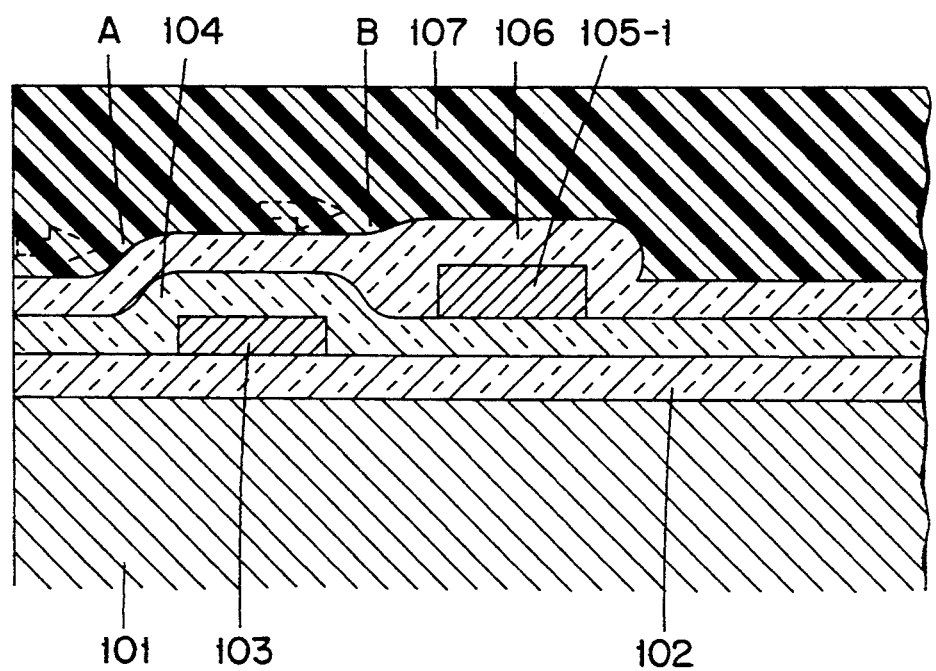
FIG. 1B is an enlarged cross section taken along a line 1—1 in FIG. 1A.

Step portions A and B are formed on the cover film 106 as shown in FIG. 1B. The height of the step portion A is substantially the same as the thickness of the polysilicon film 103 and the height of the step portion B is substantially equal to a difference value in thickness between the aluminum film 105-1 and the polysilicon film 103. In the design of an integrated circuit, it is usual that the thickness of a lower conductive film layer is smaller than that of an upper conductive layer film.

Compressive stress of the sealing resin 107 is divided to the step portions A and B in directions shown by arrows in FIG. 1B. Therefore, slide of the aluminum film 105-1 is prevented. Further, as mentioned previously, since the interlayer insulating film 104 is flattened by reflow, there is substantially no such defect as a void and thus its mechanical strength is improved. Since the side walls of the step portion A are inclined slightly, the risk of a crack of the cover film 106 in the step portion A is substantially reduced. Therefore, it is possible to prevent the polysilicon film 103 from sliding. The polysilicon film can be used as not only a dummy conductive film for preventing slide of the aluminum film 103 but also a signal line. It is not always necessary to arrange such ring shaped dummy conductive film in the outer peripheral portion of the semiconductor chip. That is, it may be possible to divide the rectangular ring shaped polysilicon film 103 into four L shaped portions in the corner portions of the chip and four straight portions each between adjacent two of the four L shaped portions. In such case, it is possible to use the four L shaped portions as dummy conductive films and the straight portions as signal lines.

A second embodiment of the present invention will described with reference to FIGS. 2A and 2B.

As in the first embodiment, a rectangular ring shaped polysilicon film 103 (first conductive film layer) is arranged in a peripheral portion of a semiconductor chip. Inside the polysilicon film 103, a first aluminum film layer 105-3 (second conductive film layer) is arranged through a first interlayer insulating film 104-1 which is of reflown BPSG film, and, inside the first aluminum layer 105-3, a second aluminum film layer 105-4 (third conductive film layer) is provided through a second interlayer insulating film 104-2. The second aluminum layer 105-4 is used as a signal line or a power source line. The second interlayer insulating film 104-2 is flattened by formation of Spin-On-Glass (SOG) film or etch-back thereof.

Since, in the second embodiment, the compressive stress of the sealing resin is divided to three step portions A, B and C, the slide phenomena, etc., can be prevented more reliably than in the case of the first embodiment. The polysilicon film 103 and the first aluminum film 105-3 are not always used as dummy conductive layers, as mentioned previously for the case of the first embodiment.

As the first layer of conductive film, other material than polysilicon film, such as refractory metal silicide film or a polycide film formed by laminating a refractory metal silicide film on a polysilicon film may be used. For conductive layers above the first layer of conductive film, not only aluminum film but also any conductive material usable for a wiring of a semiconductor device, such as Al—Si alloy or Al—Si—Cu alloy, may be used.

As described hereinbefore, since the present invention resides in a layout of conductive films of a semiconductor device, there is no need of adding specific step or steps to a fabrication method thereof.

Although the present invention has been described with reference to specific embodiments, this description is not meant to be construed in a limiting sense. Various modifications of the disclosed embodiments, as well as other embodiments of the present invention, will become apparent to persons skilled in the art upon reference to the description of the invention. It is therefore contemplated that the appended claims will cover any modifications or embodiments as fall within the true scope of the present invention.

What is claimed is:

1. A semiconductor device having a multilevel wiring structure including a plurality of wirings at an upper-level and a lower-level, said semiconductor device comprising:

a semiconductor substrate having an edge defining a periphery thereof;

a first insulating film formed on said semiconductor substrate;

a second insulating film formed on said first insulating film;

a first wiring at said upper-level formed on said second insulating film in parallel to and adjacent to said edge of said semiconductor substrate;

a second wiring at said lower-level inserted between said first insulating film and said second insulating film at a position between said first wiring and said edge of said semiconductor substrate along said first wiring to thereby partially bulge said second insulating film to form a bulging portion of said second insulating film; and a third insulating film formed on said second insulating film and said first wiring, said bulging portion of said second insulating film forming first and second steps in a surface of said third insulating film between said first wiring and said edge of said semiconductor substrate.

2. The semiconductor device as claimed in claim 1, wherein said multilevel wiring structure further includes a wiring at an intermediate-level formed on said second insulating film at a position between said first and second wirings along said first wiring to thereby further bulge said third insulating film, said surface of said third insulating film further having a third step between said first wiring and said edge of said semiconductor substrate.

3. A semiconductor device, comprising:

semiconductor substrate having an edge defining a periphery thereof;

first insulating film formed on said semiconductor substrate;

second insulating film formed on said first insulating film;

a bonding pad formed on said second insulating film;

a first wiring elongated from said bonding pad and extended on said second insulating film in parallel to and adjacent to said edge of said semiconductor substrate;

a third insulating film formed on said second insulating film and said first wiring;

a hole selectively formed in said third insulating film to expose a part of said bonding pad; and a second wiring inserted between said first insulating film and said second insulating film, said second wiring being arranged between said edge of said semiconductor substrate and said first wiring along said first wiring to thereby form a first step and a second step at a surface of said third insulating film between said edge of said semiconductor substrate and said first wiring.

* * * * *